(12) United States Patent
Uemura et al.

(10) Patent No.: US 7,387,989 B2
(45) Date of Patent: Jun. 17, 2008

(54) $Al_xGa_yIn_{1-x-y}N$ SUBSTRATE, CLEANING METHOD OF $Al_xGa_yIn_{1-x-y}N$ SUBSTRATE, AlN SUBSTRATE, AND CLEANING METHOD OF AlN SUBSTRATE

(75) Inventors: Tomoki Uemura, Itami (JP); Keiji Ishibashi, Itami (JP); Shinsuke Fujiwara, Itami (JP); Hideaki Nakahata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 314 days.

(21) Appl. No.: 11/148,239

(22) Filed: Jun. 9, 2005

(65) Prior Publication Data

US 2006/0003134 A1 Jan. 5, 2006

(30) Foreign Application Priority Data

Jul. 1, 2004 (JP) ............................. 2004-195506
Jul. 1, 2004 (JP) ............................. 2004-195507

(51) Int. Cl.
*H01L 21/302* (2006.01)
(52) U.S. Cl. ....................... 510/175; 134/1.3
(58) Field of Classification Search ................ 510/175; 134/1.3
See application file for complete search history.

(56) References Cited

U.S. PATENT DOCUMENTS 6,230,720 B1 * 5/2001 Yalamanchili et al. ....... 134/1.3
6,447,604 B1 9/2002 Flynn et al.

2003/0045102 A1 * 3/2003 Nagasawa et al. .......... 438/689

OTHER PUBLICATIONS

Toshio Nishida, et al. "GaN-free transparent ultraviolet light-emitting diodes", 2003, Appl. Phys. Lett., vol. 82, No. 1.
Toshio Nishida, et al., "The Characteristics of UV-LED Grown on Bulk *AlN* Substrate Under Large Current Injection", the 51st spring meeting of the Japan Society of Applied Physics and Related Societies, extended abstracts, 2004, p. 409.
Chinese Office Action issued in Chinese Patent Application No. CN 200510082192.6, dated Oct. 12, 2007.

* cited by examiner

*Primary Examiner*—Gregory E Webb
(74) *Attorney, Agent, or Firm*—McDermott Will & Emery LLP

(57) ABSTRACT

An $Al_xGa_yIn_{1-x-y}N$ substrate in which particles having a grain size of at least 0.2 μm on a surface of the $Al_xGa_yIn_{1-x-y}N$ substrate are at most 20 in number when a diameter of the $Al_xGa_yIn_{1-x-y}N$ substrate is two inches, and a cleaning method with which the $Al_xGa_yIn_{1-x-y}N$ substrate can be obtained are provided. Further, an $Al_xGa_yIn_{1-x-y}N$ substrate in which, in a photoelectron spectrum of a surface of the $Al_xGa_yIn_{1-x-y}N$ substrate by X-ray photoelectron spectroscopy with a detection angle of 10°, a ratio between a peak area of $C_{1s}$ electrons and a peak area of $N_{1s}$ electrons ($C_{1s}$ electron peak area/$N_{1s}$ electron peak area) is at most 3, and a cleaning method with which the $Al_xGa_yIn_{1-x-y}N$ substrate can be obtained are provided. Still further, an AlN substrate in which, in a photoelectron spectrum of a surface of the AlN substrate by X-ray photoelectron spectroscopy with a detection angle of 10°, a ratio between a peak area of $Al_{2s}$ electrons and a peak area of $N_{1s}$ electrons ($Al_{2s}$ electron peak area/$N_{1s}$ electron peak area) is at most 0.65 and a cleaning method with which the AlN substrate can be obtained are provided.

3 Claims, 4 Drawing Sheets

AL$_x$GA$_y$IN$_{L-x-y}$N SUBSTRATE, CLEANING METHOD OF AL$_x$GA$_y$IN$_{L-x-y}$N SUBSTRATE, ALN SUBSTRATE, AND CLEANING METHOD OF ALN SUBSTRATE

BACKGROUND OF THE INVENTION

1. Field of the Invention

The present invention relates to an Al$_x$Ga$_y$In$_{1-x-y}$N (0<x≦1, 0≦y≦1, x+y≦1) substrate and a cleaning method of the Al$_x$Ga$_y$In$_{1-x-y}$N (0<x≦1, 0≦y≦1, x+y≦1) substrate. The present invention also relates to an AlN substrate with which an epitaxial film of low haze level can stably be grown, and a cleaning method of the AlN substrate. In this specification, Al$_x$Ga$_y$In$_{1-x-y}$N (0<x≦1, 0≦y≦1, x+y≦1) is abbreviated as Al$_x$Ga$_y$In$_{1-x-y}$N.

2. Description of the Background Art

An Al$_x$Ga$_y$In$_{1-x-y}$N substrate can be suitably used as a substrate for various semiconductor devices such as optical devices and/or electronic devices.

A representative growth method of an Al$_x$Ga$_y$In$_{1-x-y}$N crystal is HVPE (Hydride Vapor Phase Epitaxy) method, and an Al$_x$Ga$_y$In$_{1-x-y}$N substrate can be manufactured from the Al$_x$Ga$_y$In$_{1-x-y}$N crystal. By growing various epitaxial films on the surface of Al$_x$Ga$_y$In$_{1-x-y}$N substrate, semiconductor devices such as optical devices and/or electronic devices can be obtained.

Among Al$_x$Ga$_y$In$_{1-x-y}$N substrates, an AlN substrate has an energy bandgap of 6.2 eV, a thermal conductivity of about 3.3 WK$^{-1}$cm$^{-1}$ and high electric resistance, and therefore it is receiving attention as a substrate for various semiconductor devices such as optical devices and/or electronic devices.

The AlN substrate can be manufactured from an AlN crystal grown through HVPE method or sublimation method. By growing various epitaxial films on the surface of the AlN substrate, semiconductor devices such as optical devices and/or electronic devices can be obtained.

For example, a light emitting diode obtained by growing an AlGaN film and the like on an AlN substrate is disclosed in Toshio Nishida et al., "GaN-free transparent ultraviolet light-emitting diodes", 2003, Appl. Phys. Lett., vol. 82, No. 1. Additionally, a light emitting diode formed on a bulk AlN substrate is disclosed in Toshio Nishida et al., "The Characteristics of UV-LED Grown on Bulk AlN Substrate Under Large Current Injection", the 51st spring meeting of the Japan Society of Applied Physics and Related Societies, extended abstracts, March 2004, p. 409.

SUMMARY OF THE INVENTION

When an epitaxial film is grown on the surface of an Al$_x$Ga$_y$In$_{1-x-y}$N substrate, sometimes an epitaxial film of low quality with a large amount of defects and/or tarnishes is grown. A semiconductor device using such an epitaxial film of low quality has poor device characteristics, and therefore there is a need for stably growing an epitaxial film of high quality with few defects and/or tarnishes.

Accordingly, in order to stably grow an epitaxial film of high quality with few defects and/or tarnishes, particles and/or organic substances attached to the surface of an Al$_x$Ga$_y$In$_{1-x-y}$N substrate have been removed by cleaning. However, since there is no conventional art reference that refers to the degree of removing the particles and/or organic substances on the surface of an Al$_x$Ga$_y$In$_{1-x-y}$N substrate and the standard thereof is unclear, there has been a problem that variations in the surface condition of Al$_x$Ga$_y$In$_{1-x-y}$N substrates directly lead to variations in the quality of epitaxial films.

Additionally, when an epitaxial film is grown on the surface of an AlN substrate, sometimes an epitaxial film with high haze level is grown. A semiconductor device using such an epitaxial film with high haze level has poor device characteristics, and therefore there is a need for stably growing an epitaxial film with low haze level.

Accordingly, in order to stably grow an epitaxial film with low haze level, an AlN substrate has been cleaning. However, since the standard of the surface of an AlN substrate that can stably grow an epitaxial film with low haze level is unclear, there has been a problem that variations in the surface condition of Al$_x$Ga$_y$In$_{1-x-y}$N substrates directly lead to variations in the quality of epitaxial films.

An object of the present invention is to provide an Al$_x$Ga$_y$In$_{1-x-y}$N substrate with which an epitaxial film of high quality can stably be grown, and a cleaning method for obtaining the Al$_x$Ga$_y$In$_{1-x-y}$N substrate. Further object of the present invention is to provide an AlN substrate with which an epitaxial film with low haze level can be grown, and a cleaning method for obtaining the AlN substrate.

The present invention is directed to an Al$_x$Ga$_y$In$_{1-x-y}$N substrate in which particles having a grain size of at least 0.2 μm on a surface of the Al$_x$Ga$_y$In$_{1-x-y}$N substrate are at most 20 in number when a diameter of the Al$_x$Ga$_y$In$_{1-x-y}$N substrate is two inches. Here, in the present specification, an Al$_x$Ga$_y$In$_{1-x-y}$N substrate refers to a nitride crystal substrate containing aluminum (Al), and it may contain gallium (Ga) and/or indium (In) in addition to aluminum and nitrogen.

Further, the present invention is directed to a cleaning method of an Al$_x$Ga$_y$In$_{1-x-y}$N substrate, in which the Al$_x$Ga$_y$In$_{1-x-y}$N substrate is soaked in a cleaning solution made of one selected from the group consisting of an ammonia water, an ammonia hydroxide/hydrogen peroxide mixture and an organoalkali aqueous solution while being subjected to ultrasound, whereby particles having a grain size of at least 0.2 μm on a surface of the Al$_x$Ga$_y$In$_{1-x-y}$N substrate are made to be at most 20 in number when a diameter of said Al$_x$Ga$_y$In$_{1-x-y}$N substrate is two inches.

Here, preferably in the cleaning method of the Al$_x$Ga$_y$In$_{1-x-y}$N substrate of the present invention, as the cleaning solution, one of an ammonia water having an ammonia concentration of at least 0.5 weight percent, an ammonia hydroxide/hydrogen peroxide mixture having a hydrogen peroxide solution concentration of at least 0.1 weight percent and an ammonia concentration of at least 0.1 weight percent, and an organoalkali aqueous solution having an organoalkali concentration of at least 0.5 weight percent is used.

In the cleaning method of an Al$_x$Ga$_y$In$_{1-x-y}$N substrate of the present invention, preferably the organoalkali aqueous solution is organoalkali dissolved in water, the organoalkali being one of tetramethylammoniun hydroxide and 2-hydroxyethyl trimethylammonium hydroxide.

Further, in the cleaning method of an Al$_x$Ga$_y$In$_{1-x-y}$N substrate of the present invention, a soaking time of the Al$_x$Ga$_y$In$_{1-x-y}$N substrate is at least 30 seconds.

Still further, the present invention is directed to an Al$_x$Ga$_y$In$_{1-x-y}$N substrate in which, in a photoelectron spectrum of a surface of the Al$_x$Ga$_y$In$_{1-x-y}$N substrate by X-ray photoelectron spectroscopy with a detection angle of 10°, a ratio between a peak area of C$_{1S}$ electrons and a peak area of N$_{1s}$ electrons (C$_{1s}$ electron peak area/N$_{1s}$ electron peak area) is at most 3.

Still further, the present invention is directed to a cleaning method of an $Al_xGa_yIn_{1-x-y}N$ substrate in which the $Al_xGa_yIn_{1-x-y}N$ substrate is soaked in an acid solution, whereby, in a photoelectron spectrum of a surface of the $Al_xGa_yIn_{1-x-y}N$ substrate by X-ray photoelectron spectroscopy with a detection angle of 10°, a ratio between a peak area of $C_{1s}$ electrons and a peak area of $N_{1s}$ electrons ($C_{1s}$ electron peak area/$N_{1s}$ electron peak area) is made to be at most 3.

Here, preferably in the cleaning method of an $Al_xGa_yIn_{1-x-y}N$ substrate of the present invention, the acid solution is made of at least one selected from the group consisting of hydrofluoric acid, hydrochloric acid and sulfuric acid, or made of a mixture of at least one selected from the group consisting of hydrofluoric acid, hydrochloric acid and sulfuric acid and a hydrogen peroxide solution.

Further, preferably in the cleaning method of an $Al_xGa_yIn_{1-x-y}N$ substrate of the present invention, when the acid solution is made of at least one selected from the group consisting of hydrofluoric acid, hydrochloric acid and sulfuric acid, a total concentration of hydrofluoric acid, hydrochloric acid and sulfuric acid in the acid solution is at least 0.5 weight percent, and when the acid solution is made of a mixture of at least one selected from the group consisting of hydrofluoric acid, hydrochloric acid and sulfuric acid and a hydrogen peroxide solution, a total concentration of hydrofluoric acid, hydrochloric acid and sulfuric acid in the acid solution is at least 0.1 weight percent, while a concentration of the hydrogen peroxide solution is at least 0.1 weight percent.

Still further, preferably in the cleaning method of an $Al_xGa_yIn_{1-x-y}N$ substrate of the present invention, a soaking time of the $Al_xGa_yIn_{1-x-y}N$ substrate is at least 30 seconds.

The present invention is directed to an AlN substrate in which, in a photoelectron spectrum of a surface of the AlN substrate by X-ray photoelectron spectroscopy with a detection angle of 10°, a ratio between a peak area of $Al_{2s}$ electrons and a peak area of $N_{1s}$ electrons ($Al_{2s}$ electron peak area/$N_{1s}$ electron peak area) is at most 0.65.

Further, the present invention is directed to a cleaning method of an AlN substrate, in which the AlN substrate is soaked in an acid solution, whereby, in a photoelectron spectrum of a surface of the AlN substrate by the X-ray photoelectron spectroscopy with a detection angle of 10°, a ratio between a peak area of $Al_{2s}$ electrons and a peak area of $N_{1s}$ electrons ($Al_{2s}$ electron peak area/$N_{1s}$ electron peak area) is made to be at most 0.65.

Here, preferably in the cleaning method of an AlN substrate of the present invention, the acid solution is made of at least one selected the group consisting of nitric acid, phosphoric acid and acetic acid.

Further, preferably in the cleaning method of an AlN substrate of the present invention, a concentration of the acid solution is at least 0.5 weight percent.

Further, preferably in the cleaning method of an AlN substrate of the present invention, a soaking time of the AlN substrate is at least 40 seconds.

According to the present invention, an $Al_xGa_yIn_{1-x-y}N$ substrate with which an epitaxial film of high quality can stably be grown and a cleaning method for obtaining the $Al_xGa_yIn_{1-x-y}N$ substrate can be provided.

Further, according to the present invention, an AlN substrate with which an epitaxial film with low haze level can be grown and a cleaning method for obtaining the AlN substrate can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
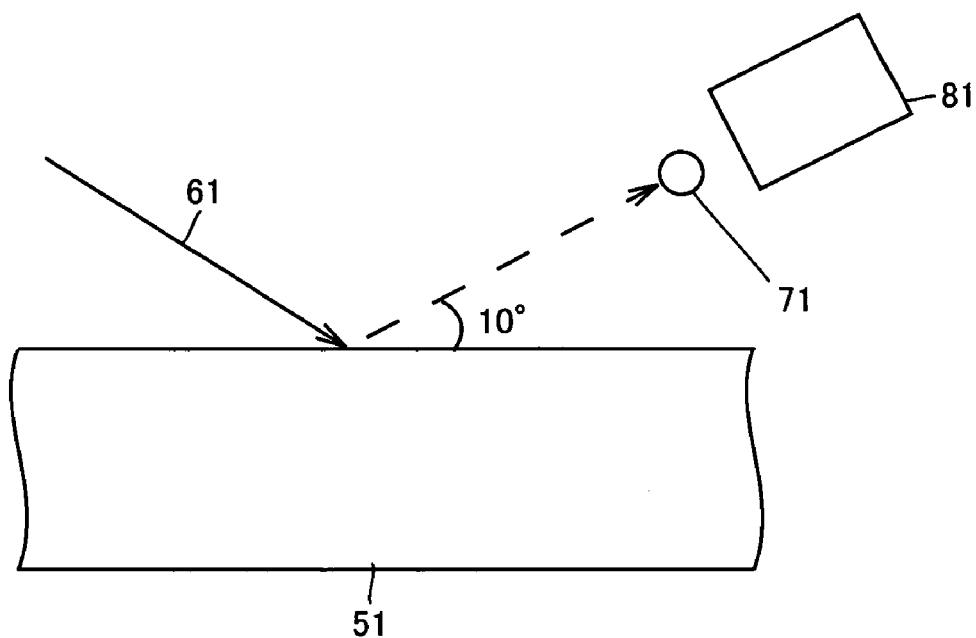
FIGS. 1 and 2 are schematic diagrams illustrating one example of X-ray photoelectron spectroscopy with a detection angle of 10° according to the present invention.

The present invention is directed to an $Al_xGa_yIn_{1-x-y}N$ substrate in which particles having a grain size of at least 0.2 μm on a surface of the $Al_xGa_yIn_{1-x-y}N$ substrate are at most 20 in number when a diameter of the $Al_xGa_yIn_{1-x-y}N$ substrate is two inches. This is based on the findings of the present inventors that an epitaxial film with few defects and of high quality can be grown when particles having a grain size of at least 0.2 μm on the surface of an $Al_xGa_yIn_{1-x-y}N$ substrate are controlled to be as above in number.

Here, the number of particles on the surface of the $Al_xGa_yIn_{1-x-y}N$ substrate is calculated by counting all the particles having a grain size of at least 0.2 μm on the surface of the $Al_xGa_yIn_{1-x-y}N$ substrate, and then converting the number of the particles being counted into a value where the diameter of the $Al_xGa_yIn_{1-x-y}N$ substrate is assumed to be two inches. Accordingly, in the present invention, the size of an $Al_xGa_yIn_{1-x-y}N$ substrate is not limited. For example, an $Al_xGa_yIn_{1-x-y}N$ substrate having a diameter of four inches is four times greater in area than an $Al_xGa_yIn_{1-x-y}N$ substrate having a diameter of two inches. Therefore, when the $Al_xGa_yIn_{1-x-y}N$ substrate having a diameter of four inches is used, ¼ of the total number of particles on the surface corresponds to the number of particles as used herein. It is noted that the particles are counted using a conventionally known substrate surface inspecting apparatus of light scattering scheme or the like. Additionally, the material of the particles is not specifically limited.

The present invention is directed to a cleaning method in which an $Al_xGa_yIn_{1-x-y}N$ substrate is soaked in a cleaning solution selected from the group consisting of an ammonia water, an ammonia hydroxide/hydrogen peroxide mixture and an organoalkali aqueous solution while being subjected to ultrasound, whereby particles having a grain size of at least 0.2 μm on a surface of the $Al_xGa_yIn_{1-x-y}N$ substrate are made to be at most 20 in number when a diameter of the $Al_xGa_yIn_{1-x-y}N$ substrate is two inches.

Here, the an ammonia hydroxide/hydrogen peroxide mixture refers to a mixture of a hydrogen peroxide solution and an ammonia water. Additionally, the organoalkali aqueous solution refers to organoalkali dissolved in water, and it is preferable to use as the organoalkali one of tetramethylammonium hydroxide expressed by structural formula (1) below, and 2-hydroxyethyl trimethylammonium hydroxide expressed by structural formula (2) below.

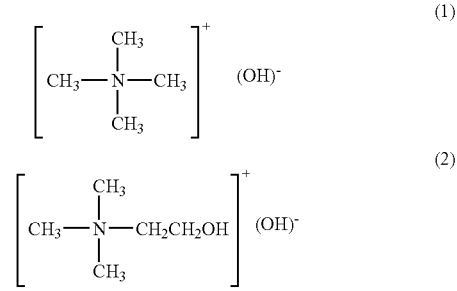

When an ammonia water is used as the cleaning solution, preferably the concentration of ammonia relative to the whole cleaning solution is at least 0.5 weight percent. When an ammonia hydroxide/hydrogen peroxide mixture is used as the cleaning solution, preferably the concentration of a hydrogen peroxide solution relative to the whole cleaning solution is at least 0.1 weight percent and the concentration of ammonia is at least 0.1 weight percent. When an organoalkali aqueous solution is used as the cleaning solution, preferably the concentration of organoalkali relative to the whole cleaning solution is at least 0.5 weight percent. By defining the concentration of the cleaning solution as above, the number of particles on the surface of an $Al_xGa_yIn_{1-x-y}N$ substrate tends to be controlled more stably as above.

Preferably, the soaking time of an $Al_xGa_yIn_{1-x-y}N$ substrate in a cleaning solution is at least 30 seconds. In this case, as the $Al_xGa_yIn_{1-x-y}N$ substrate is sufficiently soaked in the cleaning solution, the number of particles on the surface of an $Al_xGa_yIn_{1-x-y}N$ substrate tends to be controlled more stably as above. Here, the soaking time of the $Al_xGa_yIn_{1-x-y}N$ substrate is the time period from the time point at which the cleaning liquid is subjected to ultrasound.

Further, the present invention is directed to an $Al_xGa_yIn_{1-x-y}N$ substrate in which, in a photoelectron spectrum of a surface of the $Al_xGa_yIn_{1-x-y}N$ substrate by the X-ray photoelectron spectroscopy with a detection angle of 10° the ratio between a peak area of $C_{1s}$ electrons and a peak area of $N_{1s}$ electrons ($C_{1s}$ electron peak area/$N_{1s}$ electron peak area) is at most 3. This is based on the findings of the present inventors that an epitaxial film of high quality without any tarnish can be grown when the ratio between the peak area of $C_{1s}$ electrons and the peak area of $N_{1s}$ electrons is controlled as above. Here, the ratio between a peak area of $C_{1s}$ electrons and a peak area of $N_{1s}$ electrons in a photoelectron spectrum of a surface of the $Al_xGa_yIn_{1-x-y}N$ substrate by the X-ray photoelectron spectroscopy (XPS) with a detection angle of 10° indicates the amount of organic substances on the surface of the $Al_xGa_yIn_{1-x-y}N$ substrate relative to nitrogen near the surface of the $Al_xGa_yIn_{1-x-y}N$ substrate. By controlling the ratio thereof as above, an epitaxial film of high quality without any tarnish can be grown.

Here, $C_{1s}$ electrons refers to electrons of 1s orbit of C (carbon), while $N_{1s}$ electrons refers to electrons of 1s orbit of N (nitrogen). As shown in FIG. 1, by irradiation of X-ray 61, $C_{1s}$ electrons and $N_{1s}$ electrons on the surface of $Al_xGa_yIn_{1-x-y}N$ substrate 51 are released as photoelectrons 71.

Thereafter, photoelectrons 71 released with an angle of 10° relative to the surface of $Al_xGa_yIn_{1-x-y}N$ substrate 51 is detected by a detector 81 (detection angle 10°) to obtain the photoelectron spectrum. The ratio between a peak area of $C_{1s}$ electrons and a peak area of $N_{1s}$ electrons of this photoelectron spectrum is determined.

Further, the present invention is directed to a cleaning method in which an $Al_xGa_yIn_{1-x-y}N$ substrate is soaked in an acid solution, whereby, in a photoelectron spectrum of a surface of the $Al_xGa_yIn_{1-x-y}N$ substrate by the X-ray photoelectron spectroscopy with a detection angle of 10°, the ratio between a peak area of $C_{1s}$ electrons and a peak area of $N_{1s}$ electrons ($C_{1s}$ electron peak area/$N_{1s}$ electron peak area) is made to be at most 3.

Here, preferably the acid solution is at least one selected from the group consisting of hydrofluoric acid, hydrochloric acid and sulfuric acid. Further preferably, the acid solution is a mixture of at least one selected from the group consisting of hydrofluoric acid, hydrochloric acid and sulfuric acid and a hydrogen peroxide solution. In this case, the ratio between the peak area of $C_{1s}$ electrons and the peak area of $N_{1s}$ electrons in a photoelectron spectrum as above tends to be controlled to be at most 3 more stably.

Further, preferably, when the acid solution is made of at least one selected from the group consisting of hydrofluoric acid, hydrochloric acid and sulfuric acid, the total concentration of hydrofluoric acid, hydrochloric acid and sulfuric acid in the acid solution is at least 0.5 weight percent. Further, preferably, when the acid solution is made of a mixture of at least one selected from the group consisting of hydrofluoric acid, hydrochloric acid and sulfuric acid and a hydrogen peroxide solution, the total concentration of hydrofluoric acid, hydrochloric acid and sulfuric acid in the acid solution is at least 0.1 weight percent, while the concentration of a hydrogen peroxide solution is at least 0.1 weight percent. In this case, the ratio between the peak area of $C_{1s}$ electrons and the peak area of $N_{1s}$ electrons in a photoelectron spectrum as above tends to be controlled to be at most three further stably.

Preferably, the soaking time of the $Al_xGa_yIn_{1-x-y}N$ substrate in the acid solution is also at least 30 seconds. In this case, as the $Al_xGa_yIn_{1-x-y}N$ substrate is sufficiently soaked in the acid solution, the ratio between the peak area of $C_{1s}$ electrons and the peak area of $N_{1s}$ electrons as above tends to be controlled as above more stably.

Further, the present invention is directed to an AlN substrate in which, in a photoelectron spectrum of a surface of the AlN substrate by the X-ray photoelectron spectroscopy (XPS) with a detection angle of 10°, the ratio between a peak area of $Al_{2s}$ electrons and a peak area of $N_{1s}$ electrons ($Al_{2s}$ electron peak area/$N_{1s}$ electron peak area) is at most 0.65. This is based on the findings of the present inventors that an epitaxial film with low haze level can be grown when the ratio between the peak area of $Al_{2s}$ electrons and the peak area of $N_{1s}$ electrons is controlled as above.

When an epitaxial film is grown using MOVPE method (Metal Organic Vapor Phase Epitaxial Growth method) or MBE method (Molecular Beam Epitaxy method) on an AlN substrate, the surface of the AlN substrate is heated before growing the film. As N (nitrogen) in the surface of the AlN substrate is volatilized more than Al (aluminum) by the heating of the surface of the AlN substrate, much Al is contained in the chemical composition of the surface of the AlN substrate when the epitaxial film is grown. Accordingly, by making the chemical composition of the surface of the AlN substrate to contain much N in advance, an epitaxial film with low haze level can be grown. This is based on the findings of the present inventors that, as the standard of the surface of the AlN substrate, an AlN substrate, of which ratio between the peak area of $Al_{2s}$ electrons and a peak area of $N_{1s}$ electrons in a photoelectron spectrum of a surface of the AlN substrate by the X-ray photoelectron spectroscopy (XPS) with a detection angle of 10° is at most 0.65, may be used.

Figure 2:
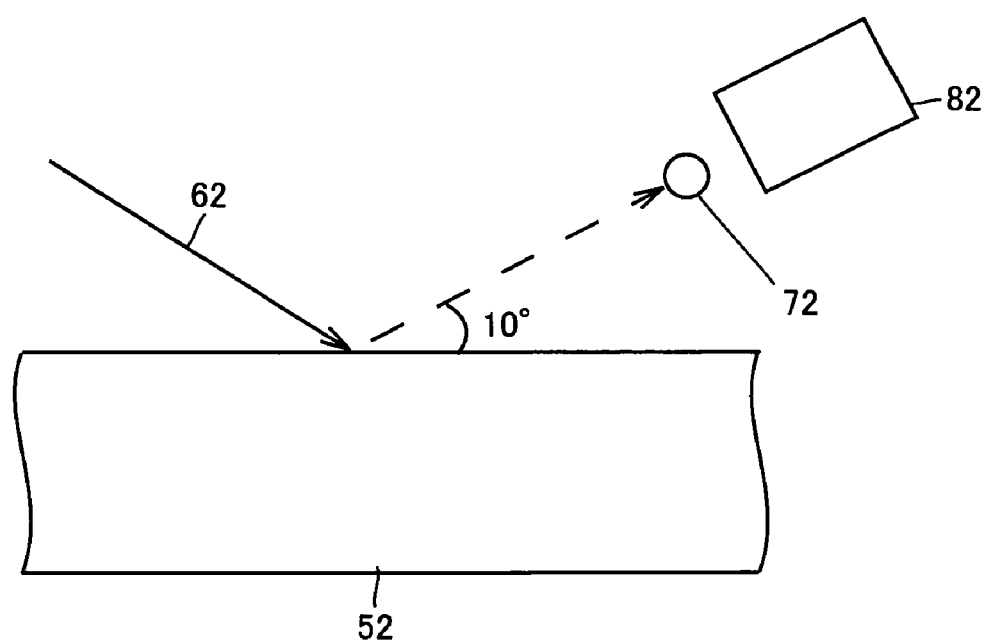

Here, $Al_{2s}$ electrons refer to electrons of 2s orbit of Al, while $N_{1s}$ electrons refer to electrons of 1s orbit of N. As shown in FIG. 2, by irradiation of X-ray 62, $Al_{2s}$ electrons and $N_{1s}$ electrons on the surface of AlN substrate 52 are released as photoelectrons 72. Thereafter, photoelectrons 72 released with an angle of 10° relative to the surface of AlN substrate 52 is detected by a detector 82 (detection angle 10°) to obtain the photoelectron spectrum. The ratio between a peak area of $Al_{2s}$ electrons and a peak area of $N_{1s}$ electrons of this photoelectron spectrum is determined.

Further, the present invention is directed to a cleaning method in which an AlN substrate is soaked in an acid solution, whereby, in a photoelectron spectrum of a surface of the AlN substrate by the X-ray photoelectron spectroscopy with a detection angle of 10°, the ratio between a peak area of $Al_{2s}$ electrons and a peak area of $N_{1s}$ electrons ($Al_{2s}$ electron peak area/$N_{1s}$ electron peak area) is made to be at most 0.65.

Here, preferably, the acid solution is made of at least one of hydrofluoric acid, hydrochloric acid and sulfuric acid, or a mixture solution made of at least two of these acid. In this case, the ratio between the peak area of $Al_{2s}$ electrons and the peak area of $N_{1s}$ electrons as above tends to be controlled to be at most 0.65 more stably.

Further, preferably, the concentration of the acid solution is at least 0.5 weight percent relative to the whole acid solution. In this case, the ratio between the peak area of $Al_{2s}$ electrons and the peak area of $N_{1s}$ electrons in a photoelectron spectrum as above tends to be controlled to be at most 0.65 further stably.

Preferably, the soaking time of the AlN substrate in the acid solution is at least 40 seconds. In this case, as the AlN substrate is sufficiently soaked in the acid solution, the ratio between the peak area of $Al_{2s}$ electrons and the peak area of $N_{1s}$ electrons as above tends to be controlled as above more stably.

Embodiment

EXAMPLE 1

First, 50 pieces of AlN substrates having a diameter of two inches were prepared, each obtained by mirror-grinding an AlN crystal grown through HVPE method and thereafter removing a damage layer due to the mirror grinding. Here, the 50 pieces of AlN substrates each have a thickness of 400 μm, and the surface of an AlN substrate is a plane 2° off from orientation (0001).

Figure 3:
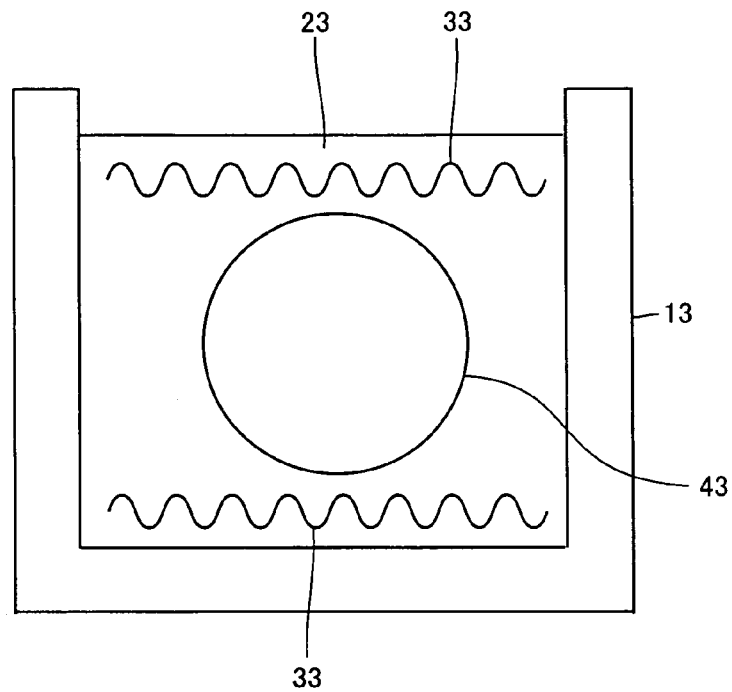
FIG. 3 is a schematic cross-sectional view of a cleaning apparatus used in Example 1.

Next, using a cleaning apparatus shown in the schematic cross-sectional view of FIG. 3, the 50 pieces of AlN substrates were cleaned with respective different soaking time periods. Here, a cleaning bath 13 shown in FIG. 3 was filled with tetramethylammonium hydroxide aqueous solution in various concentrations as a cleaning solution 23. Ultrasound 33 at a frequency of 900 kHz was applied to cleaning solution 23, in which AlN substrates 43 were soaked, with the same condition as to each of 50 pieces of AlN substrates 43.

Then, for each AlN substrate after cleaning, the number of particles having a grain size of at least 0.2 μm on the surface of the AlN substrate was counted with a substrate surface inspection apparatus of the light scattering scheme.

Thereafter, an epitaxial film formed of an AlN crystal of 1 μm thickness was grown on the surface of each of the 50 pieces of AlN substrates under the same condition through MOVPE method (Metal Organic Vapor Phase Epitaxial Growth method). Then, with the same substrate surface inspection apparatus as above, the number of defects of the epitaxial films was counted.

Figure 4:
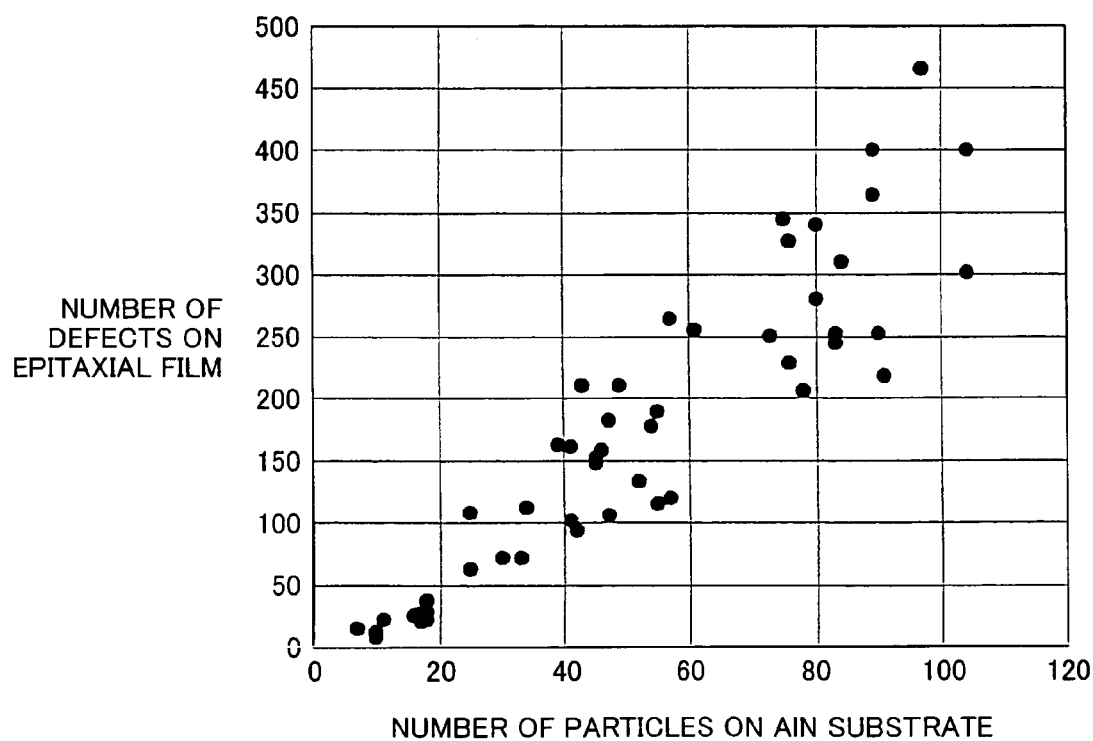
FIG. 4 shows the relationship between the number of particles and the number of defects in an epitaxial film grown on the surface of an AlN substrate in Example 1.

FIG. 4 shows the result of this experiment. In FIG. 4, the abscissa indicates the number of particles having a grain size of at least 0.2 μm on the surface of AlN substrate after cleaning counted in a manner described above, while the ordinate indicates the number of defects counted for the epitaxial film grown on the surface of the AlN substrate, corresponding to the number of particles of the abscissa.

As can be seen from FIG. 4, when the number of particles having a grain size of at least 0.2 μm on the surface of an AlN substrate having a diameter of two inches was made to be at most 20, the number of defects in the epitaxial film grown on that surface is less than 50. Thus, as compared to a case with the particles more than 20, the epitaxial film of high quality with less defects was obtained.

The AlN substrate, in which the number of particles having a grain size of at least 0.2 μm on the surface is at most 20, was the one cleaned with the cleaning solution in which the concentration of tetramethylammonium hydroxide relative to the whole cleaning solution was made to be at least 0.5 weight percent and with the soaking time of at least 30 seconds.

While the AlN substrates were used in Example 1 above, it is considered that the similar result can be obtained when $Al_xGa_yIn_{1-x-y}N$ substrates other than the AlN substrates are used. Additionally, the thickness and plane orientation of the AlN substrate are not limited as described above, and a result similar to Example 1 can be obtained with arbitrary values.

EXAMPLE 2

First, similarly to Example 1, 50 pieces of AlN substrates having a diameter of two inches were prepared, each obtained by mirror-grinding an AlN crystal and thereafter removing a damage layer due to the mirror grinding. Here, the 50 pieces of AlN substrates each have a thickness of 400 μm, and the surface of an AlN substrate is a plane 2° off from orientation (0001).

Figure 5:
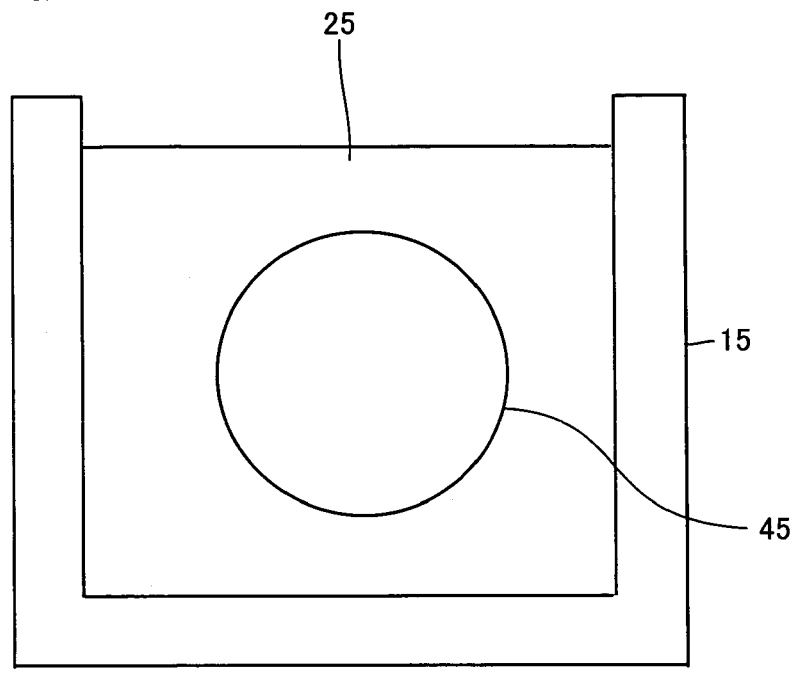
FIG. 5 is a schematic cross-sectional view of a cleaning apparatus used in Example 2.

Next, using a cleaning apparatus shown in the schematic cross-sectional view of FIG. 5, the 50 pieces of AlN substrates were cleaned with respective different soaking time periods. Here, a cleaning bath 15 shown in FIG. 5 was filled with hydrochloric acid in various concentrations as an acid solution 25 to soak respective AlN substrates 45.

Then, for each AlN substrate after cleaning, a photoelectron spectrum of the surface of the AlN substrate was measured by an X-ray photoelectron spectroscopy apparatus employing Kα ray of Mg as X-ray source with a detection angle of 10° to calculate the ratio between a peak area of $C_{1s}$ electrons and a peak area of $N_{1s}$ electrons ($C_{1s}$ electron peak area/$N_{1s}$ electron peak area).

Thereafter, on the surface of each of 50 pieces of AlN substrates, an epitaxial film formed of an AlN crystal of 1 μm thickness was grown under the same condition through MOVPE method. Then, for each epitaxial film thus grown, whether tarnishes are present or not was visually evaluated based on the standard below. The epitaxial films with tarnishes were counted for each category ($C_{1s}$ electron peak area/$N_{1s}$ electron peak area) shown in Table 1. The result is shown in Table 1.

TABLE 1

| ($C_{1s}$ electron peak area/$N_{1s}$ electron peak area) | at most 3 | greater than 3 and at most 5 | greater than 5 |
|---|---|---|---|
| The number of AlN substrates with tarnishes/Total number of AlN substrates | 0/15 | 5/27 | 7/8 |

Evaluation Standard for the Presence of Tarnishes

Tarnish present—a portion of an epitaxial film is not finished as a mirror surface Tarnish not present—an epitaxial film is entirely finished as a mirror surface As can be seen from Table 1, there was a tendency that the smaller ratio between the peak area of $C_{1s}$ electrons and the peak area of $N_{1s}$ electrons ($C_{1s}$ electron peak area/$N_{1s}$ electron peak area) corresponds to less tarnishes. In special, when the ratio is at most 3, no tarnishes were present on the epitaxial film, and the epitaxial film of high quality was grown.

The AlN substrate, in which the ratio between the peak area of $C_{1s}$ electrons and the peak area of $N_{1s}$ electrons ($C_{1s}$ electron peak area/$N_{1s}$ electron peak area) was at most 3, was the one cleaned with the cleaning solution in which the concentration of hydrochloric acid relative to the whole cleaning solution was made to be at least 0.5 weight percent and with the soaking time of at least 30 seconds.

While the AlN substrates were used in Example 2 above, it is considered that the similar result can be obtained when $Al_xGa_yIn_{1-x-y}N$ substrates other than the AlN substrates are used. Additionally, the thickness and plane orientation of the AlN substrate are not limited as described above, and a result similar as Example 2 can be obtained with arbitrary values.

EXAMPLE 3

First, 50 pieces of AlN substrates having a diameter of two inches were prepared, each obtained by mirror-grinding an AlN crystal grown through HVPE method and thereafter removing a damage layer due to the mirror grinding. Here, the 50 pieces of AlN substrates each have a thickness of 400 µm, and the surface of an AlN substrate is a plane 2° off from orientation (0001).

Figure 6:
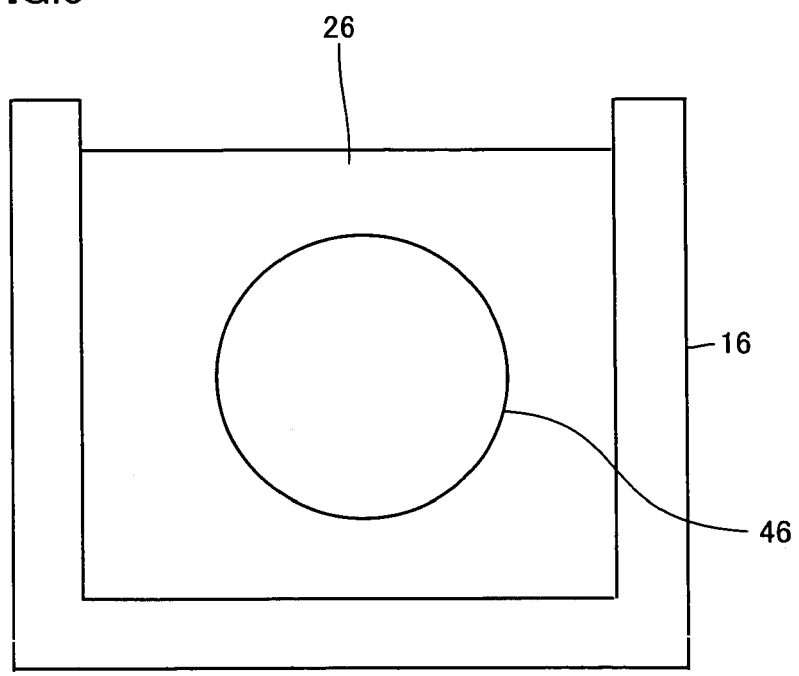
FIG. 6 is a schematic cross-sectional view of a cleaning apparatus used in Example 3.

Next, using a cleaning apparatus shown in the schematic cross-sectional view of FIG. 6, the 50 pieces of AlN substrates were each cleaned. Here, a cleaning bath 16 shown in FIG. 6 was filled with mixture solution of nitric acid, phosphoric acid and acetic acid in various concentrations as a cleaning solution 26 to clean AlN substrates 46 with various different cleaning time periods.

Then, for each AlN substrate after cleaning, a photoelectron spectrum of the surface of the AlN substrate was measured by an X-ray photoelectron spectroscopy apparatus employing Kα ray of Mg as X-ray source with a detection angle of 10° to calculate the ratio between a peak area of $Al_{2s}$ electrons and a peak area of $N_{1s}$ electrons ($Al_{2s}$ electron peak area/$N_{1s}$ electron peak area).

Figure 7:
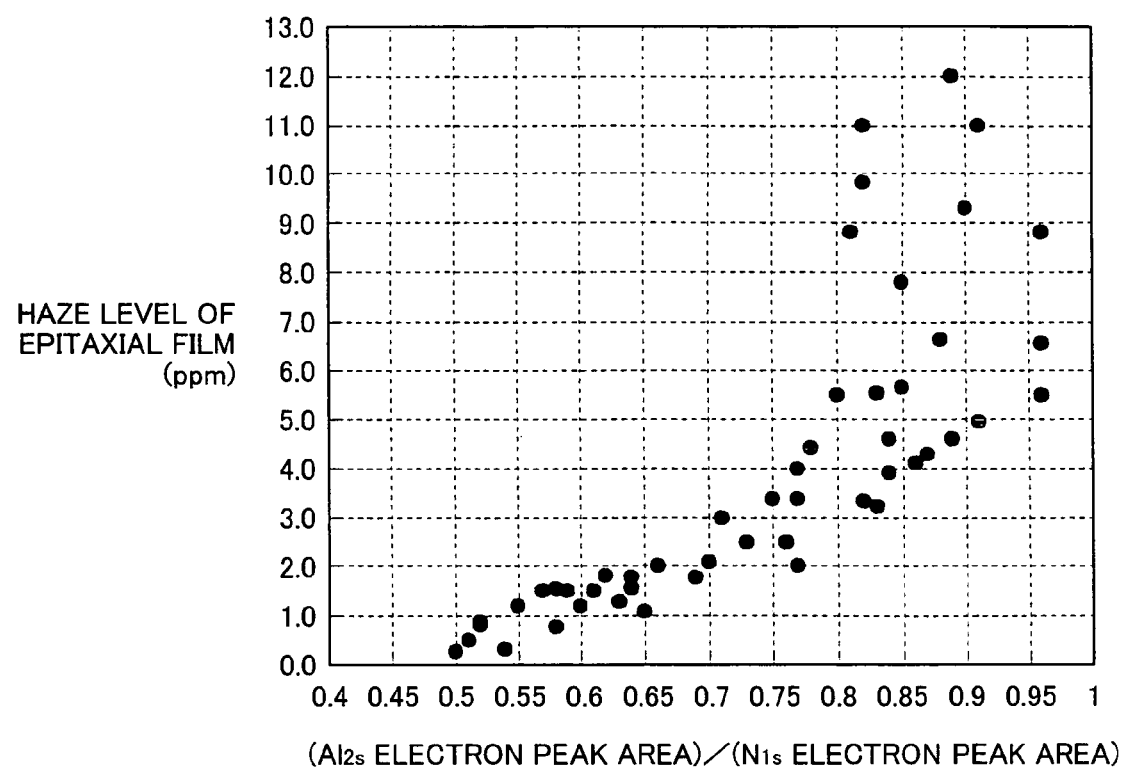
FIG. 7 shows the relationship between the ratio between a peak area of $Al_{2s}$ electrons and a peak area of $N_{1s}$ electrons ($Al_{2s}$ electron peak area/$N_{1s}$ electron peak area) on an AlN substrate after cleaning and the haze level of an epitaxial film grown on the surface of the AlN substrate in Example 3.

Thereafter, an epitaxial film formed of an AlN crystal of 1 µm thickness was grown on the surface of each of 50 pieces of AlN substrates under the same condition through MOVPE method. Then, with a substrate surface inspection apparatus of the light scattering scheme, the haze level was evaluated for each epitaxial film thus grown. The result is shown in FIG. 7. In FIG. 7, the abscissa indicates the ratio between a peak area of $Al_{2s}$ electrons and a peak area of $N_{1s}$ electrons ($Al_{2s}$ electron peak area/$N_{1s}$ electron peak area) of the AlN substrate after cleaning obtained by the X-ray photoelectron spectroscopy apparatus, while the ordinate indicates the haze level of an epitaxial film grown on each AlN substrate having ($Al_{2s}$ electron peak area/$N_{1s}$ electron peak area) of the abscissa.

As can be seen from FIG. 7, there was a tendency that the smaller ratio between the peak area of $Al_{2s}$ electrons and the peak area of $N_{1s}$ electrons ($Al_{2s}$ electron area/$N_{1s}$ electron peak area) corresponds to lower haze level of an epitaxial film. In special, when the ratio is at most 0.65, the haze level of the epitaxial film is lower than 2 ppm, and an excellent epitaxial film was grown.

The AlN substrate, in which the ratio between the peak area of $Al_{2s}$ electrons and the peak area of $N_{1s}$ electrons ($Al_{2s}$ electron peak area/$N_{1s}$ electron peak area) was at most 0.65, was the one cleaned with the acid solution in which the concentration of nitric acid, phosphoric acid and acetic acid relative to the whole cleaning solution was made to be at least 0.5 weight percent and with the soaking time of at least 40 seconds.

While the mixture solution of nitric acid, phosphoric acid and acetic acid was used in Example 3 above, it is considered that the similar result can be obtained when one of nitric acid, phosphoric acid and acetic acid, or a mixture solution made of two of these acid is used.

Additionally, the thickness and plane orientation of the AlN substrate are not limited as described above, and a result similar to Example 3 can be obtained with arbitrary values.

The present invention may suitably be used in the manufacture of a semiconductor device using an $Al_xGa_yIn_{1-x-y}N$ substrate. Further, the present invention may suitably be used in the manufacture of a semiconductor device using an AlN substrate is used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A cleaning method of an $Al_xGa_yIn_{1-x-y}N$ substrate, wherein $0<x \leq 1$, $0 \leq y \leq 1$, $x+y \leq 1$, said $Al_xGa_yIn_{1-x-y}N$ substrate is soaked in a cleaning solution made of one selected from the group consisting of an ammonia water, an ammonia hydroxide/hydrogen peroxide mixture and an organoalkali aqueous solution while being subjected to ultrasound, whereby particles having a grain size of at least 0.2 µm on a surface of said $Al_xGa_yIn_{1-x-y}N$ substrate are made to be at most 20 in number when a diameter of said $Al_xGa_yIn_{1-x-y}N$ substrate is two inches, as said cleaning solution, one of an ammonia water having an ammonia concentration of at least 0.5 weight percent, an ammonia hydroxide/hydrogen peroxide mixture having a hydrogen peroxide solution concentration of at least 0.1 weight percent and an ammonia concentration of at least 0.1 weight percent, and an organoalkali aqueous solution having an organoalkali concentration of at least 0.5 weight percent is used, said organoalkali aqueous solution is organoalkali dissolved in water, said organoalkali being one of tetramethylammonium hydroxide and 2-hydroxyethyl trimethylammonium hydroxide, and a soaking time of said $Al_xGa_yIn_{1-x-y}N$ substrate is at least 30 seconds.

2. A cleaning method of an $Al_xGa_yIn_{1-x-y}N$ substrate, wherein $0<x\leq 1$, $0\leq y\leq 1$, $x+y\leq 1$, said $Al_xGa_yIn_{1-x-y}N$ substrate is soaked in an acid solution, whereby, in a photoelectron spectrum of a surface of said $Al_xGa_yIn_{1-x-y}N$ substrate by X-ray photoelectron spectroscopy with a detection angle of 10°, a ratio between a peak area of $C_{1s}$ electrons and a peak area of $N_{1s}$ electrons ($C_{1s}$ electron peak area/$N_{1s}$ electron peak area) is made to be at most 3, said acid solution is made of at least one selected from the group consisting of hydrofluoric acid, hydrochloric acid and sulfuric acid, or made of a mixture of at least one selected from the group consisting of hydrofluoric acid, hydrochloric acid and sulfuric acid and a hydrogen peroxide solution, when said acid solution is made of at least one selected from the group consisting of hydrofluoric acid, hydrochloric acid and sulfuric acid, a total concentration of hydrofluoric acid, hydrochloric acid and sulfuric acid in said acid solution is at least 0.5 weight percent, and when said acid solution is made of a mixture of at least one selected from the group consisting of hydrofluoric acid, hydrochloric acid and sulfuric acid and a hydrogen peroxide solution, a total concentration of hydrofluoric acid, hydrochloric acid and sulfuric acid in said acid solution is at least 0.1 weight percent, while a concentration of the hydrogen peroxide solution is at least 0.1 weight percent, and a soaking time of said $Al_xGa_yIn_{1-x-y}N$ substrate is at least 30 seconds.

3. A cleaning method of an AlN substrate, wherein said AlN substrate is soaked in an acid solution, whereby, in a photoelectron spectrum of a surface of said AlN substrate by the X-ray photoelectron spectroscopy with a detection angle of 10°, a ratio between a peak area of $Al_{2s}$ electrons and a peak area of $N_{1s}$ electrons ($Al_{2s}$ electron peak area/$N_{1s}$ electron peak area) is made to be at most 0.65, said acid solution is made of at least one selected the group consisting of nitric acid, phosphoric acid and acetic acid, a concentration of said acid solution is at least 0.5 weight percent, and a soaking time of said AlN substrate is at least 40 seconds.

* * * * *

UNITED STATES PATENT AND TRADEMARK OFFICE
CERTIFICATE OF CORRECTION

PATENT NO. : 7,387,989 B2
APPLICATION NO. : 11/148239
DATED : June 17, 2008
INVENTOR(S) : Tomoki Uemura et al.

It is certified that error appears in the above-identified patent and that said Letters Patent is hereby corrected as shown below:

On the title page of the patent, Item "(54)", change "$AL_XGA_YIN_{L-X-Y}N$ SUBSTRATE, CLEANING METHOD OF $AL_XGA_YIN_{L-X-Y}N$ SUBSTRATE, ALN SUBSTRATE AND CLEANING METHOD OF ALN SUBSTRATE" to --$AL_xGA_yIn_{1-x-y}N$ SUBSTRATE, CLEANING METHOD OF $AL_xGa_yIn_{1-x-y}N$ SUBSTRATE, ALN SUBSTRATE AND CLEANING METHOD OF ALN SUBSTRATE--; and In Column 1, Lines 1-4, change "$AL_XGA_YIN_{L-X-Y}N$ SUBSTRATE, CLEANING METHOD OF $AL_XGA_YIN_{L-X-Y}N$ SUBSTRATE, ALN SUBSTRATE AND CLEANING METHOD OF ALN SUBSTRATE" to --$AL_xGa_yIn_{1-x-y}N$ SUBSTRATE, CLEANING METHOD OF $AL_xGa_yIn_{1-x-y}N$ SUBSTRATE, ALN SUBSTRATE AND CLEANING METHOD OF ALN SUBSTRATE--.

Signed and Sealed this

Twenty-eighth Day of April, 2009

JOHN DOLL
*Acting Director of the United States Patent and Trademark Office*